United States Patent [19]
Bell

[11] Patent Number: 5,898,342
[45] Date of Patent: Apr. 27, 1999

[54] POWER AMPLIFIER ARRANGEMENT AND METHOD FOR DATA SIGNAL INTERFACE

[75] Inventor: Russell W. Bell, Austin, Tex.

[73] Assignee: Advanced Micro Devices, Austin, Tex.

[21] Appl. No.: 09/009,389

[22] Filed: Jan. 20, 1998

[51] Int. Cl.$^6$ .............................. H03F 3/04; H03M 1/66
[52] U.S. Cl. ........................................ 330/297; 341/144
[58] Field of Search .................................. 330/297, 127, 330/202; 341/144, 139

[56] References Cited

U.S. PATENT DOCUMENTS

| | | | |
|---|---|---|---|
| 4,688,001 | 8/1987 | Dijkmans et al. | 330/273 |
| 4,721,919 | 1/1988 | LaRosa et al. | 330/146 |
| 5,585,795 | 12/1996 | Yuasa et al. | 341/144 |

OTHER PUBLICATIONS

Sampei et al., "Highest Efficiency and Super Quality Audio Amplifier Using MOS Power FETs in Class G Operation", *IEEE Transactions on Consumer Electronics*, CE(24)3, pp. 300–307 (1978).

Raab et al., "Average Efficiency of Class–G Power Amplifiers", *IEEE Transactions on Consumer Electronics*, CE32(2), pp. 145–150 (1986).

*Primary Examiner*—Robert Pascal
*Assistant Examiner*—Patricia Nguyen
*Attorney, Agent, or Firm*—Merchant, Gould, Smith, Edell, Welter & Schmidt, P.A.

[57] ABSTRACT

An arrangement and method using power more efficiently for signal amplification. The approach is particularly advantageous in application environments where digital information is converted to the analog domain and carried at a variety of different magnitudes. One embodiment involves a signal processing and amplifying arrangement including a digital-to-analog converter, an amplifier and a control signal selection circuit. The digital-to-analog converter receives a digital signal and outputs, in response to the digital signal, an analog signal. The amplifier amplifies the analog signal using power received from a high-level supply and a low-level supply, at least one of which has a variable setting in response to a control signal. The amplifier is configured and arranged to amplify the analog signal. The control signal selection circuit is responsive to the digital signal, and is used for selecting the control signal to cause the supplies to the amplifier to track the expected magnitude of the analog signal.

15 Claims, 4 Drawing Sheets

POWER AMPLIFIER ARRANGEMENT AND METHOD FOR DATA SIGNAL INTERFACE

FIELD OF THE INVENTION

The present invention relates generally to power amplifier circuits and, more particularly, to such arrangements and methods used in connection with signal processing devices to prepare data streams for communications channels.

BACKGROUND OF THE INVENTION

The demand for high-speed data communications has grown tremendously over the past several years. Mobile communications and internet access are two of the market drivers that have stimulated demand for data communications solutions around the world. Users have become attracted to mobile communications. Consequently, cellular/PCS technologies have experienced rapid growth. Similarly, the wired side of the network has experienced rapid growth and users are continuing to ask for additional speed. This need for speed is driven by several items, including the desire for remote office locations to appear to operate as quickly as one's main office environment and the need for higher speed internet access. Technologies are being developed and deployed to make this a reality. However, as with all new technologies, certain deficiencies in overall system operation need to be addressed and overcome if the markets are to realize their full potential.

One of the major problems with communications systems today is power consumption. Although much improved by yesterday's standards, excessive power consumption reduces the utility of mobile communications solutions by minimizing the battery life or the time between recharging sessions (in the case of rechargeable batteries). Most wired communications systems typically have access to some form of AC power. However, even wired communications systems must be concerned with the excessive dissipation of power for a variety of reasons. First, there are excessive costs to the communications provider ensuing from the consumption of power provided by the electric company. This cost concern is so serious that certain regulated industries have converted the long-term cost of electricity into a capital expense. Second, maintaining circuits at a reasonable operating temperature adds a host of design constraints, including the inclusion of additional fans, air conditioning, heat sinks and space for thermal ventilation. These constraints significantly increase the material, labor and maintenance costs associated with the system. Third, excessive heat may restrict the density of equipment, thereby increasing the size of the facility hosting the system and/or limiting the number of customers that can be served by a fixed size facility. This may require a service provider to construct new buildings in order to accommodate demand for their service. Accordingly, reducing the power consumption in communications systems can be a key aspect of any system design.

These concerns have been addressed to a large degree through advances in the digital domain through semiconductor integration and processing. Advances in integration have provided improved performance and reduced power consumption over the years by integrating functionality into a single chip. For example, integration of this type in many instances has eliminated the need to drive external buses and the associated capacitative nature of these buses. Advances in process technology continue to reduce power consumption as switching transistor geometries and capacitances are reduced as process technology "shrinks" the internal dimensions of semiconductor devices. Electric fields become higher as devices shrink, requiring the use of smaller supply voltages for semiconductor devices. These improvements will continue over time as advances carry technology to more circuits in smaller devices.

In the analog domain, however, little progress has been made to reduce the overall power consumption for certain classes of functions that are necessary in the communications world. Traditional amplifier design continues to lag behind the digital curve in terms of techniques to reduce overall power consumption. From cell phones to high-speed internet access technologies like ADSL, linear amplifiers are often required to deliver communications services to the end user.

Over the years, a variety of techniques have been used to improve the power efficiency of amplifiers. These techniques are well known and referred to as class A, B, AB, or C operation. These terms are used to describe the amount of time that an amplifier spends "in conduction." Class A amplifiers operate over the entire cycle of an input signal; class B amplifiers operate over slightly less than 180 degrees, and class C amplifiers are used in applications that conduct over a small portion of the input cycle. Class C amplifiers are non-linear and are typically used in applications in which input signals have constant amplitude envelopes. Class C applications are typically operated in a "tuned" environment that utilizes external tuned circuits to remove any unwanted harmonics associated with the highly nonlinear amplification caused by the class C conduction angles.

For applications that require minimal distortion, class A, and class AB (a combination of class A and class B operation that provides for efficiency and low distortion) amplifiers are typically the technologies of choice for most designers.

Class D, G and H emerged from efforts to improve power efficiency. Class D amplifiers use switching transistors and pulse width modulation (width is proportional to amplitude of input signal) techniques along with passive integrators to "reconstruct" a filtered representation of the input signal by integrating the series of "pulses." As the transistors in this "amplifier" were either on or off, the power dissipation in the amplifier was minimal. Unfortunately, the audio performance was poor and distortion was quite high. Class G amplifiers were an improvement on class D technology from an audio quality point of view; although their efficiency was not as good as the class D devices. Class G amplifiers attempt to reduce the amount of power dissipated in the amplifier's transistors. Typically, amplifiers must be able to amplify a wide range of input signals. This requires the amplifier to have large power supply "rails" (high-voltage supplies that connect across the output transistors that are used to "drive" the load). When the amplifier is amplifying small signals, there is a small AC voltage that is developed across the load; there is also a current that is passing through the load. This same current is passing through the output transistors. Unfortunately, the power transistors drop the balance of the supply voltage across themselves, while supplying load current. A simple calculation reveals that these devices dissipate a substantial amount of power. Indeed, a compromise for having large voltage rails is that efficiencies become quite poor as signal levels are reduced. Ideally, the power supply rails could be switched between two supply voltages depending on the level of the input signal. Small signals do not invoke the switching of the output devices to the higher voltage (or supply) rail. Instead, small input signals tend to be amplified using the lower voltage of the two output rails. As the input signal increases in amplitude, a point is reached where the lower railed output amplifier can no longer keep up with the increasing amplitude of the input signal. When this occurs, the output transistors automatically switch to the higher voltage rail. This allows the amplifier to respond to various signal levels without consuming excessive amounts of power.

Class H amplifiers tend to operate similarly to class G amplifiers with a primary exception being that class H amplifiers tend to have continuously variable rails that track the input voltages. When circuits monitoring the input detect the need for additional power (by virtue of increased input amplitude), special circuits rapidly increase the power supply voltage across the output transistors. Class H can provide even higher potential amplifier efficiencies (at the expense of complexity), than class G amplifiers. These amplifiers have been used for typical audio applications whose signals range from DC to 20 kHz.

Engineering present-day communication systems, where efficient use of power is a primary consideration, involves the design of system pieces using different types of integrated circuits and amplifier types. Typically, the integrated circuits and amplifier types are selected based upon sets of specifications defined for each of the system pieces. Consequently, each system piece carries with it the advantages and disadvantages of the associated power-consuming integrated circuit and amplifier type. Until the disadvantages are completely eliminated, there will continue to be a need for circuit arrangements and methods of using power more efficiently for communication systems and its system pieces.

SUMMARY OF THE INVENTION

The present invention is generally directed to a signal processing and amplifying circuit arrangement and method. Consistent with the present invention, one embodiment involves a signal processing and amplifying arrangement, comprising: a digital-to-analog converter, an amplifier and a control signal selection circuit. The digital-to-analog converter receives a digital signal and outputs, in response to the digital signal, an analog signal. The amplifier amplifies the analog signal using power received from a high-level supply and a low-level supply, at least one of which has a variable setting in response to a control signal. The amplifier is configured and arranged to amplify the analog signal. The control signal selection circuit is responsive to the digital signal, and is used for selecting the control signal to cause the supplies to the amplifier to track the expected magnitude of the analog signal.

The above summary of the present invention is not intended to describe each illustrated embodiment or every implementation of the present invention. The figures in the detailed description which follow more particularly exemplify these embodiments.

BRIEF DESCRIPTION OF THE DRAWINGS

The invention may be more completely understood in consideration of the detailed description of various embodiments of the invention which follows in connection with the accompanying drawings, in which.

Figure 1:
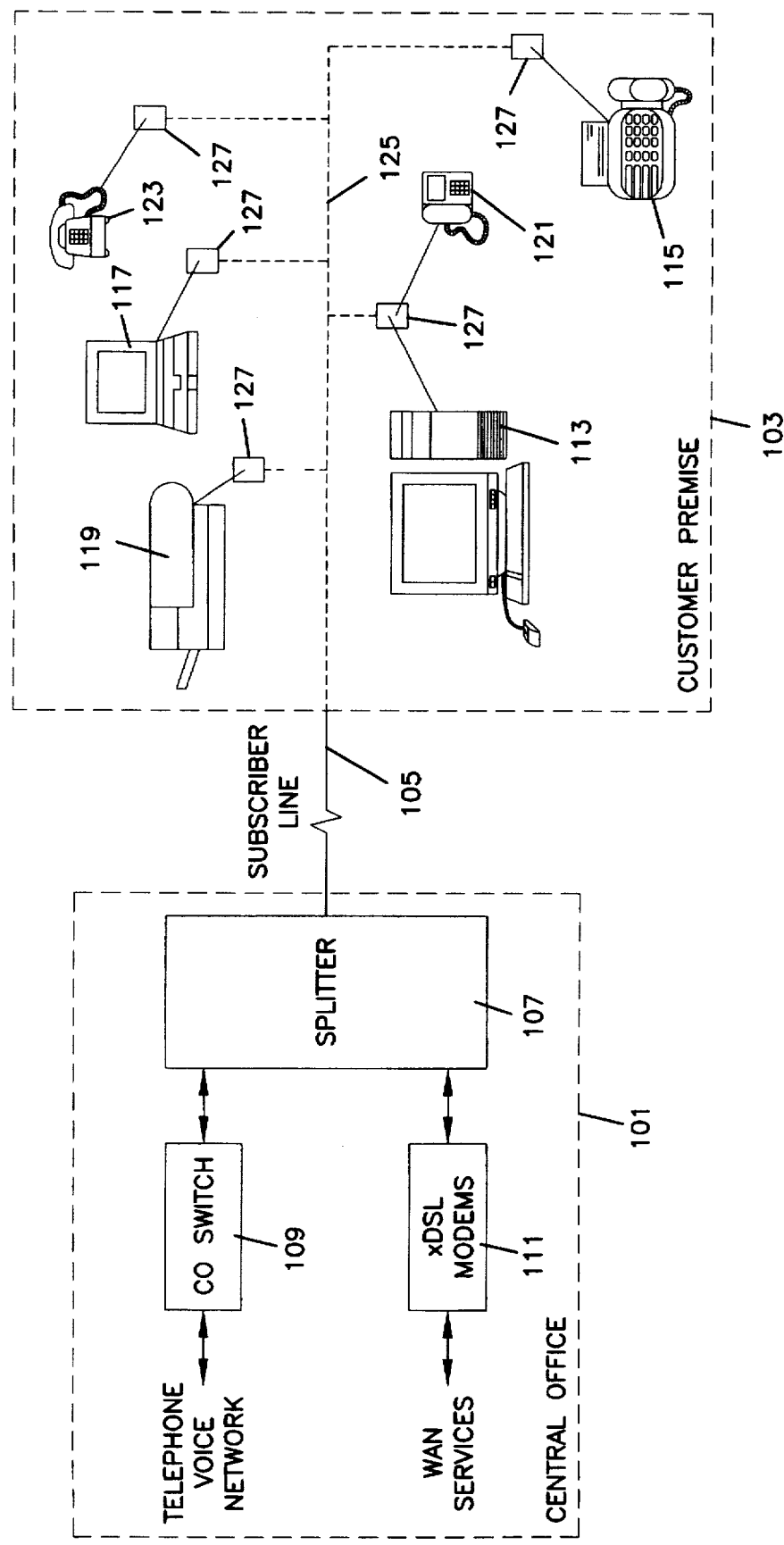
FIG. 1 represents an example system embodiment implemented in accordance with the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable to a variety of systems, different devices and data schemes which process information for communication over an analog channel. The invention has been found to be particularly advantageous in application environments where digital information is first processed and then converted to the analog domain and where power savings is an important consideration. While the present invention is not so limited, an appreciation of various aspects of the invention is best gained through a discussion of application examples operating in such an environment.

According to one aspect of the present invention, one particular signal processing and amplifying arrangement includes a digital signal processing circuit manipulating data in the form of data groups or data words for transmission over a communication channel. The digital signal processing circuit transmits digital data to a digital-to-analog converter and to comparator logic. The digital-to-analog converter outputs an analog signal corresponding to and representing the digital signal received by the digital-to-analog converter. An amplifier receives and amplifies the analog signal to provide an output which is coupled to the communication channel. The amplifier receives power from supply terminals having a variable power setting in response to a control signal provided by the comparator logic, which may be external to or part of the digital-to-analog converter. The comparator logic selects the appropriate control signal in response to a determined value of the digital signal to cause the supplies to the amplifier to track the expected magnitude of the analog signal. By modifying the power rails in this manner, the amplifier has a wider operating range for amplifying high-level analog signals, and a narrower operating range for amplifying low-level analog signals.

FIG. 1 illustrates an example operating environment benefited by the power-saving advantages of the present invention. In FIG. 1, the central office 101 of a telephone company is coupled to a customer premise 103 via a subscriber line 105. The central office 101 is equipped to provide out-of-band data transfers to the customer premise 103 via the subscriber line 105. In the illustrated example, xDSL (representing one of many types of Digital Subscriber Lines) data transmission technology is used. The central office 101 includes a splitter (or its digital equivalent) 107 which is coupled to the subscriber line 105. The splitter 107 is coupled to a standard switched telephone network via a central office switch 109. The central office also includes a bank of xDSL modems 111 which are used to communicate data band signals over the subscriber line 105. The xDSL modems 111 are coupled to a wide area network (WAN), for example. The splitter 107 separates voice and data band signals received from the subscriber line 105 and provides the respective signals to the central office switch 109 and xDSL modems 111. The splitter also combines voice and data band signals received from the central office switch 109 and xDSL modems 111 and provides the combined signal to the subscriber line 105.

The customer premise 103 includes a number of battery- and AC- powered customer devices each coupled to an internal telephone wire network 125. The customer premise devices depicted in FIG. 1 include a personal computer 113, a fax machine 115, a laptop computer 117, a printer 119, and telephones 121 and 123. The customer devices depicted in FIG. 1 generally fall into two categories.

The first category includes voice devices such as conventional telephones and fax machines. These devices use signals in the voice band to communicate with other devices adapted for voice band communication. For example, a telephone at the customer premise 103 may be connected to a remote telephone via the internal telephone wire network 125, the subscriber line 105, the central office switch 109 and the standard public switched telephone network (PSTN).

The second category of customer devices includes data devices such as personal computers, laptop computers, printers and the like. These devices communicate using the data band. The data band devices may communicate with each other over the internal telephone wire network 125. They also may communicate remotely with other data devices via the internal telephone wire network 125, the subscriber line 105, the xDSL modems 111 provided at the central office 101 and a WAN connected to the xDSL modems 111. Certain customer devices may have the capability of communicating in both the voice and data bands. For example, a computer may include a voice band modem and telephony software, such as a built in speaker phone. When communicating with another voice band modem or acting as a speaker phone, the computer communicates in the voice band via the internal telephone wire network 125, the subscriber line 105 and the telephone voice network. The computer may also have an xDSL modem used to receive Internet services. The xDSL modem may communicate with the Internet service provider via the internal telephone wire network 125, the subscriber line 105 and an xDSL modem 111 connected to the WAN of the central office 101.

In accordance with one aspect of an embodiment of the present invention, interface arrangements 127 are provided at each point of device connection to the internal telephone wire network 125 telephone. Although not shown, the interface arrangement 127 may also be included as part of the splitter 107 for the interface to the subscriber line 105. The interface arrangement 127 couples data words (or groups), representing digital data and/or voice data, from the corresponding devices to the internal telephone wire network 125 by amplifying an analog representation of the digital word using an amplifier powered at a level according to a value associated with a determined value of the digital word.

The interface arrangement 127, although depicted as an external item, may be implemented either as part of or external to the corresponding connection device. The interface arrangement 127 may used to provide other functions and aspects, such as signal splitting and filtering. For further details on signal splitting in connection with an arrangement consistent with FIG. 1, reference may be made to copending U.S. patent application, Ser. No. 08/888,870, filed Jul. 7, 1997, entitled "Device and Method For Isolating Voice and Data Signals on a Common Carrier", which is assigned to the assignee of the instant application, fully incorporated herein.

Figure 2:
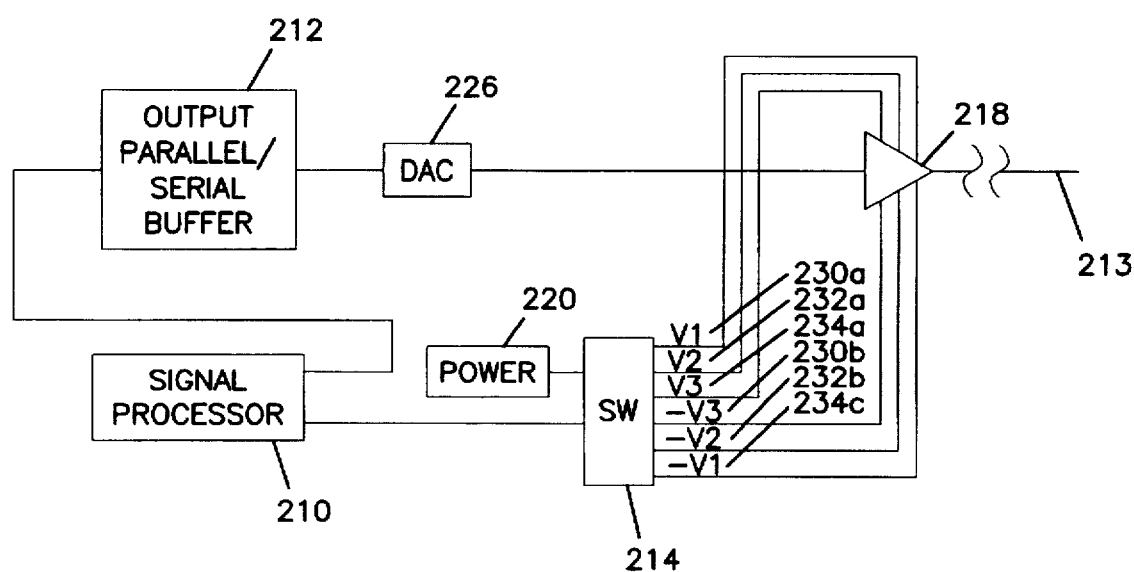
FIG. 2 is a block diagram of a signal processing arrangement, according to another embodiment of the present invention.

Referring now to FIG. 2, another specific embodiment of the present invention is shown in a manner which may be practiced consistent with the interface arrangement 127 of FIG. 1. The embodiment shown in FIG. 2 includes a signal processor 210 programmed or discreetly configured and arranged to process data from a signal source (not shown) for transmission over a communication channel 213. The signal processor 210 stores data for transmission into the output buffer 212 and, in a time coordinated manner, provides a control signal to a power switch 214 which is used to couple an appropriate level of power to an amplifier to a team. The amplifier 218 receives the data words in analog form, via a digital to analog converter 226, and amplifies the corresponding analog signal to the appropriate level as required for proper communication over the communication channel 213.

The signal processor 210 includes a logic to determine the value of data words stored in the output buffer 212. Using this determined value, the signal processor anticipates the magnitude of the analog signal to be provided by the digital to analog converter 226. The signal processor 210 then uses this determined value to select the appropriate power levels to be supplied to the amplifier 218. As shown in the example arrangement of FIG. 2, the amplifier 218 is provided one of three sets of power levels 230, 232, 234. Although not required for all applications, many communication channels receive analog signals with no intended DC offset. Thus, the power typically provided to an amplifier includes a positive voltage rail and a negative voltage rail, each measured from common (or ground). The example embodiment of FIG. 2 illustrates 3 sets of voltage rails, a high voltage set 230, a low voltage set 234 and an intermediate voltage set 232. The magnitude of the analog signal to be transmitted over the communication channel 213 using an appropriately controlled switch 214, dictates the selection of the power rails for the amplifier 218.

Figure 3:
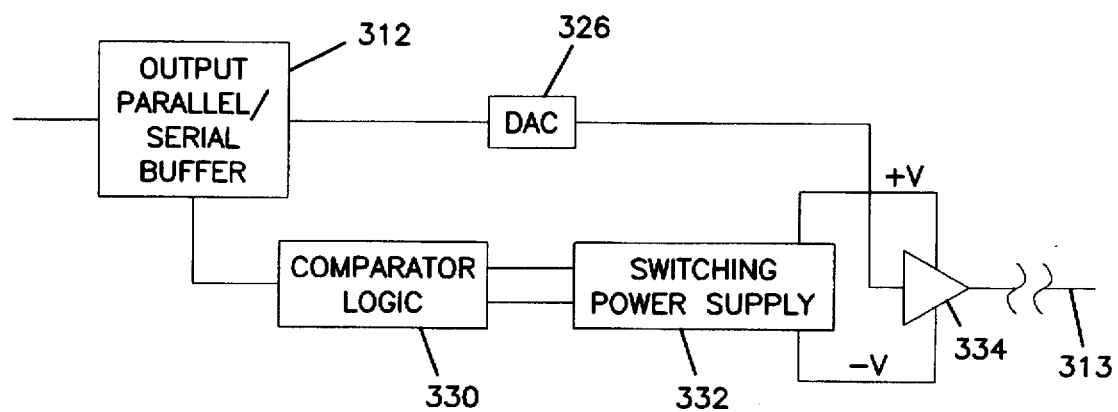
FIG. 3 is a signal processing arrangement, according to yet another embodiment of the present invention.

FIG. 3 illustrates an alternate embodiment of the present invention to the embodiment shown in FIG. 2. In this embodiment, an output buffer 312 receives data words from a signal processing arrangement (not shown), presents the data words to a digital to analog converter 326, which in turn presents a corresponding analog signal to an amplifier 334 for transmission over a communication channel 313. Unlike the arrangement of FIG. 2, the arrangement of FIG. 3 uses comparator logic 330 and a switching power supply 332 to provide a variable power rail setting for powering the amplifier 334.

The comparator logic 330 estimates the magnitude of the analog signal to be fed from the digital to analog converter 326 to the amplifier 334. Based on this estimation, the switching power supply 332 is controlled so that it provides an appropriate set of positive and negative rails from which the amplifier 334 is powered. Any restrictions on the number of settings is primarily a function of the switching power supply design and the capabilities of the amplifier 334.

For certain applications, the power rails for each of the amplifier of the embodiments of FIGS. 2 and 3 may be set to levels which are changed infrequently, if at all, after initially being set. For other application, the type of information to be transmitted over the respective communication channels may require relatively frequent altering of the power levels being provided to the respective amplifiers. For these latter types of applications, the signal processor 210 or comparator logic 330 can be configured and arranged to include a degree of hysteresis using a collection of the determined values before and after the setting of the power rails for each data word. In this manner, switching the power rail setting at an angling phase will produce reduced levels of noise.

Figure 4:
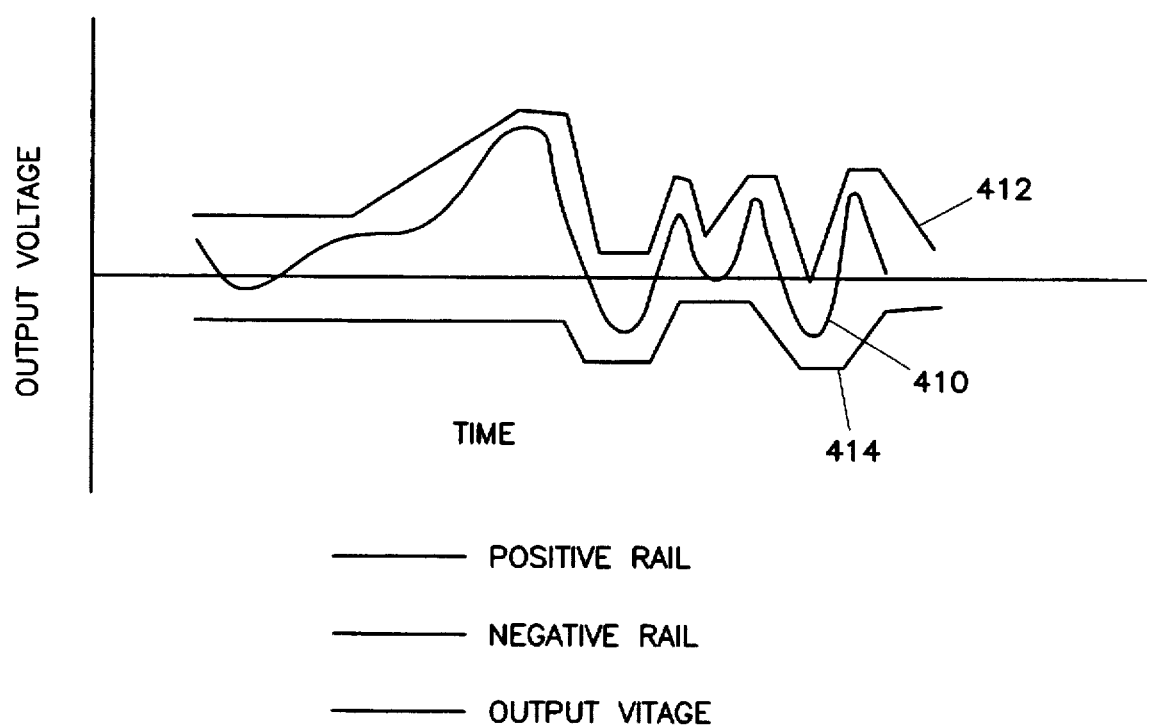
FIG. 4 is an illustration showing the output voltage of an amplifier powered by a variable pair of power rails, according to an embodiment of the present invention.

FIG. 4 illustrates a variable rail approach having an unlimited number of settings, as contemplated by the example embodiment shown in FIG. 3 in which the variable rails adjustment is controlled using a switching power supply. As shown in FIG. 4, the output voltage 410 produced by the amplifier (334 FIG. 3) is within the boundaries 412 and 414 provided by the positive and negative rails, respectively.

Modern digital communications systems use a variety of signal processing devices (in the digital domain) to prepare data streams for communications channels. Error correction, interleaving, and other functions are done prior to converting signals from the digital domain to the analog domain. The embodiments shown above in connection with FIGS. 2 and 3 are not intended to be exclusive of any type of processing.

In another example embodiment, the output buffer (of either FIG. 2 or FIG. 3) contains one or more digital samples that are to be converted to analog and transmitted (in an analog fashion) over the existing copper local loop. The DAC and analog signal processing section includes an amplifier that is capable of delivering +23 dBm into a 100 ohm load that is typical of many local loops (1 dBm=1 mW). This translates to about 200 mW of power that is to be supplied to the load (the copper loop and receiving hardware) through an amplifier. Various matching networks and other protection circuits consume another 200 mW of power. Using a class G or H amplifier for this circuit will provide additional efficiency for the output stage and reduce the overall power required for this circuit to operate. This also provides an attendant reduction in overall power consumption of the system and reduces cooling, etc.

In the simplest form, this circuit operates with two to three supply voltages, as depicted in the example embodiment of FIG. 2. The various operating voltages can be determined by examining the profile of a typical data stream that would exist using the applicable modulation schemes.

Currently, DMT (discrete multi-tone) modulation is the ANSI standard for ADSL technology. The peak-to-average ratio of a DMT time domain signal is rather large and could benefit from class G technology. Extensive signal analysis shows that DMT modulation schemes with high peak-to-average ratios can benefit from class G operation. A standard class B amplifier operating at maximum efficiency with Gaussian signals has a maximum efficiency of approximately 50 percent. Using a three supply class G amplifier, the same amplifier operates at almost 80 percent efficiency. This translates to a significant reduction in power consumption while offering the same performance of class B circuits.

What is claimed is:

1. A signal processing and amplifying arrangement, comprising:

a digital-to-analog converter configured and arranged to receive a digital signal and to output, in response to the digital signal, an analog signal;

an amplifier receiving power from a high-level supply and a low-level supply, at least one of which has a variable setting in response to a control signal, the amplifier configured and arranged to amplify the analog signal; and means, responsive to the digital signal, for selecting the control signal to cause the supplies to the amplifier to track the expected magnitude of the analog signal.

2. A signal processing and amplifying arrangement, according to claim 1, wherein the means for selecting includes a comparator circuit.

3. A signal processing and amplifying arrangement, according to claim 1, wherein the means for selecting includes a comparator circuit and a switching power supply.

4. A signal processing and amplifying arrangement, according to claim 3, wherein the comparator circuit measures the value of the digital signal relative to at least one threshold level and produces an output signal indicative of the measured value.

5. A signal processing and amplifying arrangement, according to claim 4, wherein the switching power supply provides the supplies to the amplifier in response to the output signal.

6. A signal processing and amplifying arrangement, according to claim 1, wherein the means for selecting includes a processor and a switch controlled by the processor.

7. A signal processing and amplifying arrangement, according to claim 4, wherein the switch responds to a command from the processor for switching the supplies to one of N settings, wherein N is a positive integer greater than one and less than 10.

8. A signal processing and amplifying arrangement, according to claim 1, further including a switching power supply configured and arranged to provide the variable setting.

9. A signal processing and amplifying arrangement, according to claim 1, further including a power coupling switch configured and arranged to provide the variable setting.

10. A signal processing and amplifying arrangement, comprising:

means for receiving a digital signal and outputting, in response thereto, an analog signal;

means for receiving power from a high-level supply and a low-level supply, at least one of which has a variable setting in response to a control signal, and for amplifying the analog signal; and means, responsive to the digital signal, for selecting the control signal to cause the supplies to the amplifier to track the expected magnitude of the analog signal.

11. A method for processing and amplifying a signal, comprising:

receiving a digital signal;

converting the digital signal to analog signal;

using power from a high-level supply and a low-level supply, at least one of which has a variable setting in response to a control signal, to amplify the analog signal; and selecting, in response to the digital signal, the control signal to cause the supplies to the amplifier to track the expected magnitude of the analog signal.

12. A method for processing and amplifying a signal, according to claim 11, wherein the step of selecting includes comparing the digital signal to at least one threshold value.

13. A method for processing and amplifying a signal, according to claim 11, wherein the step of selecting includes determining a value for the digital signal and using the value to define the setting.

14. A method for processing and amplifying a signal, according to claim 13, wherein the step of selecting includes using a switching power supply.

15. A method for processing and amplifying a signal, according to claim 11, wherein the step of selecting includes using a switching power supply to set the high-level and low-level supplies.

* * * * *